US007010773B1

(12) United States Patent
Bartz et al.

(10) Patent No.: US 7,010,773 B1
(45) Date of Patent: Mar. 7, 2006

(54) METHOD FOR DESIGNING A CIRCUIT FOR PROGRAMMABLE MICROCONTROLLERS

(75) Inventors: Manfred Bartz, Snohomish, WA (US); Marat Zhaksilikov, Snohomish, WA (US); Steve Roe, Woodinville, WA (US); Kenneth Y. Ogami, Bothell, WA (US); Matthew A. Pleis, Carnation, WA (US); Douglas H. Anderson, Edmund, WA (US)

(73) Assignee: Cypress Semiconductor Corp., San Jose, CA (US)

( * ) Notice: Subject to any disclaimer, the term of this patent is extended or adjusted under 35 U.S.C. 154(b) by 449 days.

(21) Appl. No.: 09/989,571

(22) Filed: Nov. 19, 2001

(51) Int. Cl.
*G06F 17/50* (2006.01)
*G06F 9/45* (2006.01)
*G06F 9/455* (2006.01)
*H03K 19/00* (2006.01)

(52) U.S. Cl. .................... 716/17; 716/1; 716/9; 716/11

(58) Field of Classification Search ................ 716/1–5, 716/7–14, 16, 17
See application file for complete search history.

(56) References Cited

U.S. PATENT DOCUMENTS 4,813,013 A 3/1989 Dunn .......................... 364/900
5,225,991 A 7/1993 Dougherty .................. 364/491
5,544,067 A * 8/1996 Rostoker et al. .............. 703/14
5,930,148 A * 7/1999 Bjorksten et al. .............. 716/6
6,014,135 A 1/2000 Fernandes ................... 345/331
6,052,524 A * 4/2000 Pauna ......................... 703/22
6,121,965 A 9/2000 Kenney et al. ............. 345/339
6,449,761 B1 * 9/2002 Greidinger et al. ........... 716/11
6,460,172 B1 * 10/2002 Insenser Farre et al. ...... 716/17
6,526,556 B1 * 2/2003 Stoica et al. .................. 716/16
6,571,373 B1 * 5/2003 Devins et al. ................. 716/5
6,578,174 B1 6/2003 Zizzo ............................ 716/1
6,615,167 B1 * 9/2003 Devins et al. ................ 703/28
6,715,132 B1 3/2004 Bartz et al. ..................... 716/1
6,817,005 B1 * 11/2004 Mason et al. ................. 716/16
2002/0099863 A1 7/2002 Comeau et al. ............. 709/310
2002/0144099 A1 10/2002 Muro, Jr. et al. ........... 712/228
2002/0156929 A1 10/2002 Hekmatpour ............... 709/310
2002/0170050 A1 11/2002 Fiorella, III et al. ........ 717/168
2002/0183956 A1 12/2002 Nightingale ................ 702/120
2002/0188910 A1 12/2002 Zizzo ............................ 716/1
2003/0163798 A1 * 8/2003 Hwang et al. ................ 716/16

* cited by examiner

*Primary Examiner*—Matthew Smith
*Assistant Examiner*—Magid Y. Dimyan

(57) ABSTRACT

A method to program a microcontroller using a software program. First a user selects a module from a catalog of available modules. The module may be for implementing an amplifier, timer, pulse width modulator, etc. This causes information related to the selected module to be displayed. For example, a schematic and data sheet for the selected module may be displayed. Next, the user requests a position and places the selected module in a graphical user interface, which represents the resources available to implement the available modules. For example, the resources may be programmable system blocks. Additional user modules may then be selected and placed. The user then configures the circuit by selecting circuit parameters for the user modules (e.g., amplifier gain), pin configurations, and interconnections between programmable system blocks. The user may then edit source code used to cause the user modules to perform their functions.

21 Claims, 16 Drawing Sheets

METHOD FOR DESIGNING A CIRCUIT FOR PROGRAMMABLE MICROCONTROLLERS

RELATED APPLICATIONS

This application is related to co-pending, commonly-owned U.S. patent application Ser. No. 09/989,570, filed Nov. 19, 2001, entitled "Method for Faciltating Microcontroller Programming," by Bartz et al.; and to co-pending, commonly-owned U.S. patent application Ser. No. 09/989,808, filed Nov. 19, 2001, entitled "Automatic Generation of Application Program Interfaces, Source Code, Interrupts, and Datasheets for Microcontroller Programming," by Bartz et al.

FIELD OF THE INVENTION

The present invention relates to the field of programmable single-chip systems. Specifically, the present invention relates to a method for designing a circuit to be implemented in a target device, such as a microcontroller, using a graphical software program.

BACKGROUND ART

Microcontrollers allow circuit designers great flexibility in design choice. However, programming the microcontroller to perform the desired functions can be an arduous task. Conventional software for programming microcontrollers is not very robust and does not offer designers many tools to reduce the amount of low level details they need to memorize in order to configure the chip.

Conventional software for programming microcontrollers is very difficult to use. In one system, many windows pop-up as the user attempts to program the microcontroller. Windows pop-up based on "flat-organized" drop down menus. Each window corresponds to a discrete function. However, many functions are required to do simple tasks. Consequently, the many displayed windows cause confusion because the user needs to keep track of which window is used for which function. Furthermore, it is very difficult to navigate between the windows because some windows overlap others. The user may have difficulty remembering which windows contain what information and which windows receive what information.

Once a circuit designer selects the various functions desired for the circuit, the designer must organize those function within the constraints of the available resources of the hardware with which the design is to be implemented. Conventionally, the circuit designer manually places the functions within the available resources of a programmable device. Unfortunately, this process is tedious and error-prone.

The circuit designer must also design the various interconnections between the selected functions, as well as configure the input/output pins. Conventionally, this can be an arduous and error-prone process. For example, the circuit designer must map the functions he has selected to actual hardware. Multifunction input/output (I/O) ports or pins may be very difficult to configure. They typically have multiple registers that needed to be programmed to configure the pin type as well as the drive characteristics for each of the I/O pins.

Circuits designers also desire to have a datasheet describing the circuit he has designed. Conventionally, the datasheets are generated manually by the designers. Each time the design is modified, a new datasheet must be manually generated. Thus, the designer time is not used efficiently and the possibility of errors in the datasheet is great.

Finally, in many conventional systems, the microcontroller devices are programmed manually. The programmer needs to know all of the registers and other technical information required to instruct the microcontroller to do its embedded functions (e.g., start timing, stop timing, etc.). Manual programming is very error prone and tedious and difficult to error check.

Therefore, it would be advantageous to provide a method which provides for a convenient user-friendly interface for designing a circuit by programming a microcontroller. It would be further advantageous to provide a method which may help reduce errors in programming a microcontroller. Finally, it would be advantageous to provide such a method for programming a microcontroller which does not require the circuit designer to memorize registers and other technical information to invoke functions when programming a microcontroller.

Therefore, it would be advantageous to provide a convenient method for designing a circuit by programming a microcontroller. It would be further advantageous to provide a method which may help reduce errors in programming a microcontroller. Finally, it would be advantageous to provide such a method for programming a microcontroller which does not require the circuit designer to memorize register and other technical information to program a microcontroller.

SUMMARY OF THE INVENTION

The present invention provides for a method for programming a microcontroller. Embodiments provide for a method which may help reduce errors in programming a microcontroller. Embodiments provide for such a method for programming a microcontroller which does not require the circuit designer to memorize registers and other technical information to program the microcontroller. The present invention provides these advantages and others not specifically mentioned above but described in the sections to follow.

A method to facilitate circuit design using a software program with a graphical user interface is disclosed. First a user selects a module from a catalog of available modules. The module may be for implementing an amplifier, timer, pulse width modulator, etc. This causes information related to the selected module to be displayed. For example, a schematic and data sheet for the selected module may be displayed. Next, the user requests a position and places the selected module in a graphical user interface, which represents the resources available to implement the available modules. For example, the resources may be programmable system blocks. Additional user modules may then be selected and placed.

The user then configures the circuit by selecting circuit parameters for the user modules (e.g., amplifier gain), pin configurations, and interconnections between programmable system blocks. The user may then edit source code used to cause the user modules to perform their functions.

Another embodiment allows the user to select a new position (e.g., new programmable system block or blocks) for a selected user module. In response to such a user request, a new potential position is computed and displayed for the user module.

DETAILED DESCRIPTION OF THE INVENTION

In the following detailed description of the present invention, a method for facilitating programming a microcontroller, numerous specific details are set forth in order to provide a thorough understanding of the present invention. However, it will be recognized by one skilled in the art that the present invention may be practiced without these specific details or with equivalents thereof. In other instances, well known methods, procedures, components, and circuits have not been described in detail as not to unnecessarily obscure aspects of the present invention.

Figure 1A:
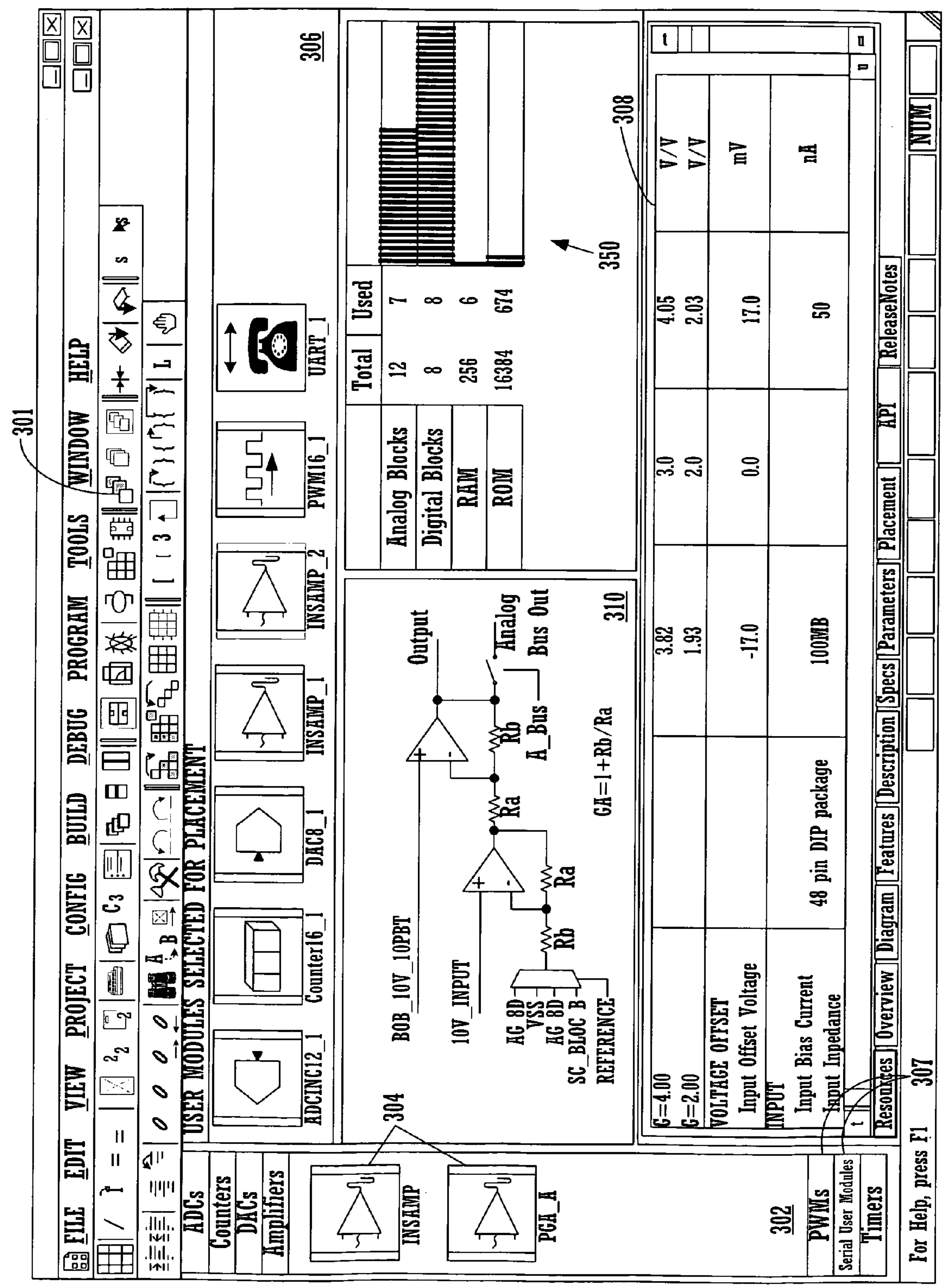
FIG. 1A is a diagram illustrating a graphical user interface allowing a user to select a user module and display its schematic and its data sheet, according to an embodiment of the present invention.

To facilitate the design process, embodiments provide various work-spaces. For example, a user may move between a user module selection work-space, a user module placement workspace, and a user module pin-out work-space. FIG. 1A illustrates an exemplary graphical user interface which allows a user to select user modules 304. Regarding user module selection, the workspace provides a user module window 302 for a catalog of available user modules 304, a listing 306 of selected user modules 304, a schematic 310 of a selected user module 304, plus its datasheet 308. The user may click on a user module 304 of user module window 302 to designate one. A histogram 350 (e.g., a series of cumulative bar charts or graphical indicators) of available resources on the target device (e.g., a microcontroller) is also shown. The datasheet 308 is tabbed for easy navigation therethrough. The various windows may be displayed simultaneously for easy reference back-and-forth. Button 301 may be used to automatically generate source code for the project.

Figure 1B:
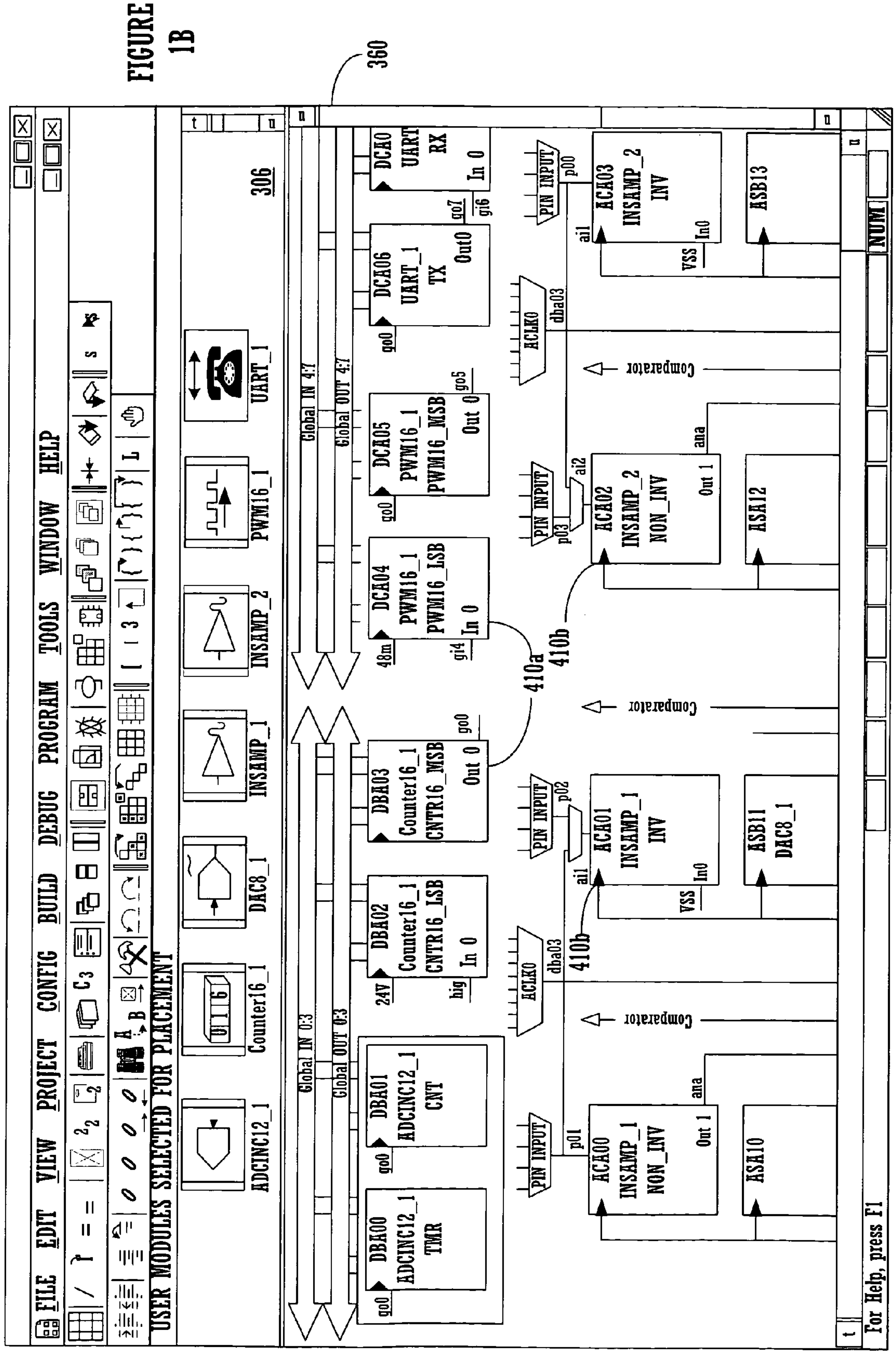
FIG. 1B is a diagram illustrating a graphical user interface allowing a user to place a user module in a graphical user interface, according to an embodiment of the present invention.

Referring now to FIG. 1B, a user module placement work-space includes a resource graphic window 360 illustrating the placement of user modules 304 with respect to the available resources (e.g., available programmable system blocks 410 of a microcontroller) in a hardware layout graphical display. Throughout this application the term resource image may denote the blocks 410 upon which user modules 304 are placed in window 360. As the resource images may represent programmable system blocks in one embodiment, the resource images may be referred to as programmable system blocks for convenience. It will be understood that the resource images may represent other resources however, as the present invention is not limited to implementing the user modules 304 in programmable system blocks. FIG. 1B shows a number of digital programmable system blocks 410*a* along the top row (e.g., the blocks labeled DBA00, DBA01, etc.), as well as four columns of analog programmable system blocks 410*b* (e.g., the blocks labeled ACA00, ACA01, etc.). The present invention is well suited to using any number of analog and digital programmable system blocks 410. Furthermore, the blocks in graphic window 360 are not limited to representing programmable system blocks.

A single user module 304 may map to one or more programmable system blocks 410. Color coding (not shown) may be used to relate the user modules 304 of selected modules window 306 with their schematic placement in resource graphic window 360. The analog 410*b* and digital 410*a* programmable system blocks may be more generally defined as two different classes to which a user module 304 maps. The present invention is well-suited to having many different classes.

Figure 1C:
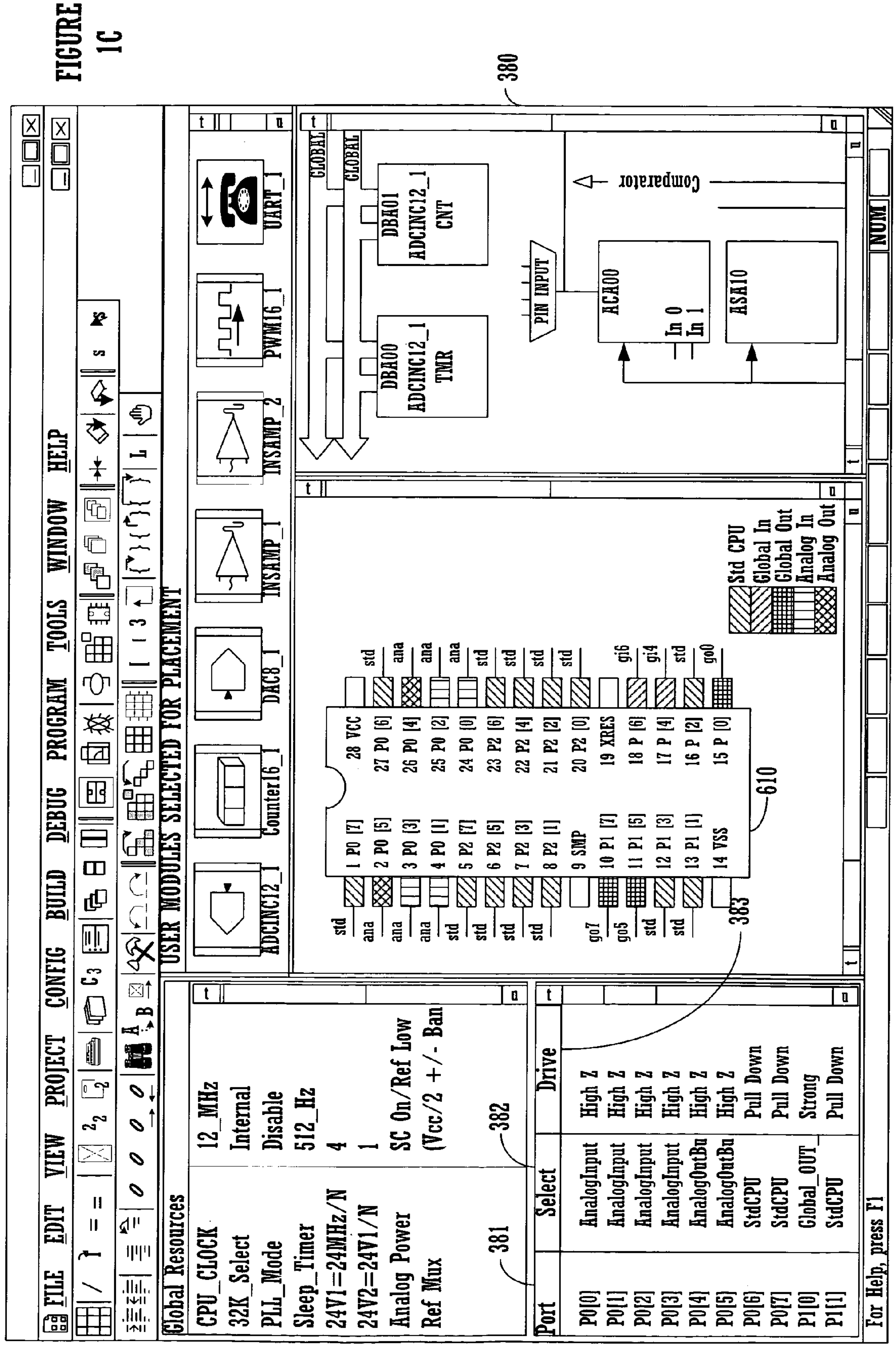
FIG. 1C is a diagram illustrating a graphical user interface allowing a user to configure pins, according to an embodiment of the present invention.

Referring now to FIG. 1C, a pin-out configuration work-space is shown. The pin-out configuration work-space allows the user to connect programmable system blocks 410 to input/output (I/O) pins, as well as configure the I/O pins' drive characteristics. In one embodiment, a pin configuration window 380 may be used to configure pins. Pin configuration window 380 has a port column 381, a select column 382, and a drive column 383. In another embodiment, a user may set pin configurations by clicking on the GUI of the chip 610. The operation of these features will be discussed more fully herein.

Figure 1D:
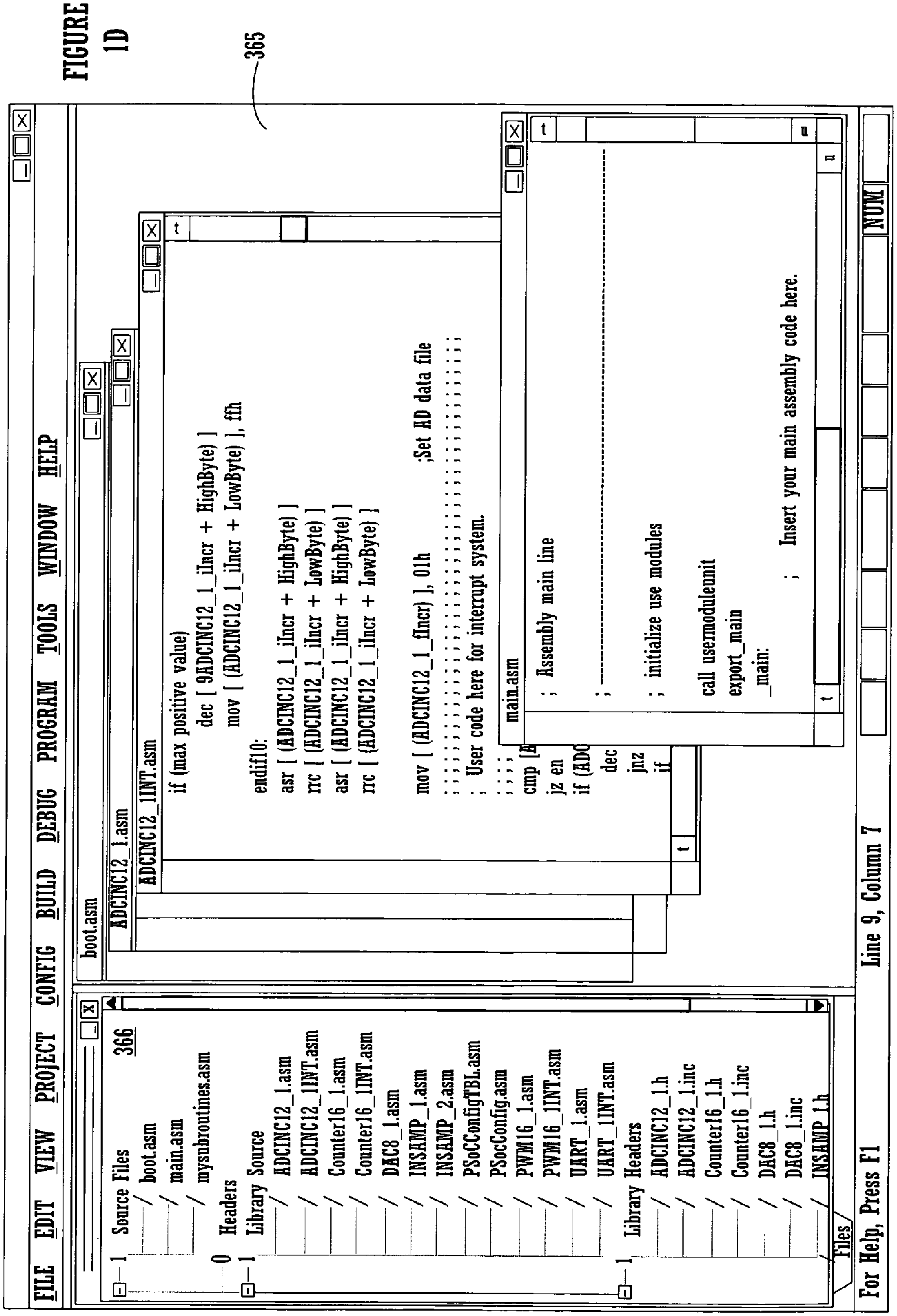
FIG. 1D is a diagram illustrating an editor workspace allowing a user to edit source code, according to an embodiment of the present invention.

Referring now to FIG. 1D, after the user has configured the device, the user may cause source code to be generated, which may be edited by the user. A directory window 366 (source tree window) provides a listing of various exemplary source code files and API files that may be automatically generated. An editor workspace 365 is provided for a user to edit various files. In this fashion, a user may program a microcontroller without having detailed knowledge of all the registers in the microcontroller.

Reference will now be made to the flowchart of FIG. 2 and FIGS. 1A–1D and FIGS. 3–6D. Referring now to step 210 of FIG. 2 and FIG. 1A, a user selects one of the available user modules 304 from user module window 302. A user module 304 may represent an accessible, pre-configured function that once programmed and placed will work as a peripheral to a target device. For example, a user module may be an amplifier, pulse width modulator, counter, digital-to-analog converter, etc. The user module window 302 of FIG. 1A shows amplifiers which may be selected. The user may select one of the 'buttons' 307 to cause the user module window 302 to display other user modules 304. (For example, to display Timers, Pulse width Modulators, etc.).

The selected user module 304 is displayed in a selected user module region 306 and a data sheet 308 and schematic 310 are displayed for the selected user module 306. FIG. 1A shows a schematic 310 for an instrumentation amplifier, along with its datasheet 308. The user is allowed to add more user modules 304 to the design by selecting more user modules 304.

User modules 304 may require multiple programmable system blocks 410 to be implemented. In some cases, user modules 304 may require special ports or hardware which will limit the number of programmable system blocks 410 that can be used for their implementation. The process of mapping a user module 304 to programmable system blocks 410, such that the user module 304 is realized within the microcontroller, may be referred to as "user module placement." An embodiment automatically determines the possible placements of a user module 304 based on an Extensible Markup Language (XML) user module description and the hardware description of the underlying chip. However, the present invention is not limited to using XML descriptions. The potential placement positions may be automatically inferred based on the XML input data. Therefore, the placement process of embodiments of the present invention is data driven.

Figure 2:
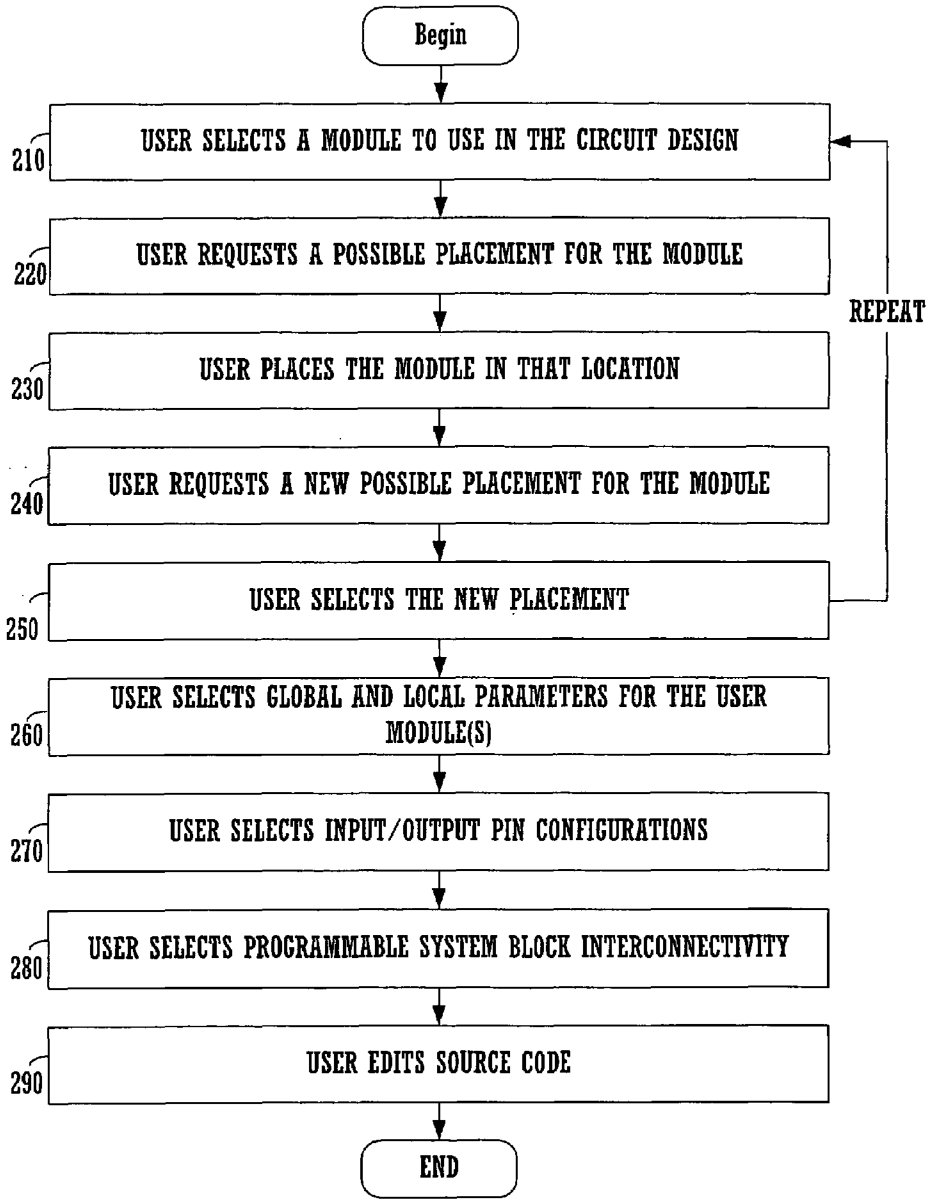
FIG. 2 is a flowchart illustrating steps of a process of programming a microcontroller, according to an embodiment of the present invention.
Figure 3A:
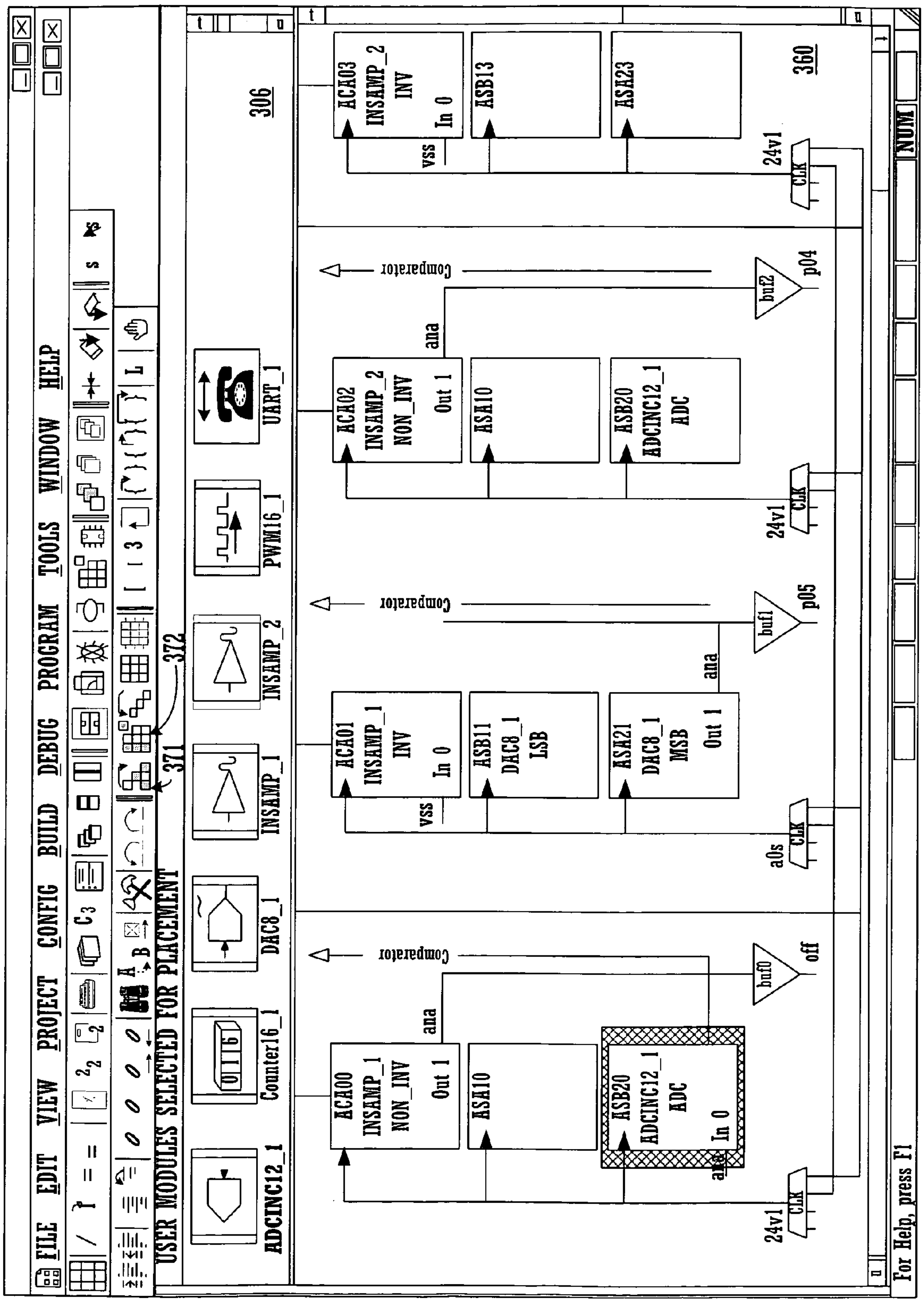
FIG. 3A, FIG. 3B, and FIG. 3C are diagrams illustrating the position of a user module being iterated to new positions, according to an embodiment of the present invention.

Referring to step 220 of FIG. 2, a user then requests a possible placement for a user module 304 in the resource area 360. One or more programmable system blocks 410 may be highlighted to indicate a possible position for the user module 304 based on, for example, XML input data. For example, referring to FIG. 1B, the ADCINC12_1 user module 304 has been selected for placement in the window 360. This user module 304 requires two digital blocks 410*a* and one analog block 410*b*. The digital programmable system blocks 410*a* labeled DBA00 and DBA01 are highlighted to indicate a possible position for the ADCINC12_1 user module 304. Referring now to FIG. 3A, the analog programmable system block 410*b* labeled ASB20 is highlighted to indicate that it is a possible position for the analog portion of the ADCINC12_1 user module 304. Embodiments may use color coding to associate the highlighting color with a unique color assigned to that user module 304.

User module placement is described in co-pending U.S. patent application Ser. No. 09/989,762, filed concurrently herewith, entitled "A SYSTEM AND METHOD FOR PERFORMING NEXT PLACEMENTS AND PRUNING OF DISALLOWED PLACEMENTS FOR PROGRAMMING AN INTEGRATED CIRCUIT," by Ogami et al., and assigned to the assignee of the present invention and incorporated herein by reference.

Figure 3B:
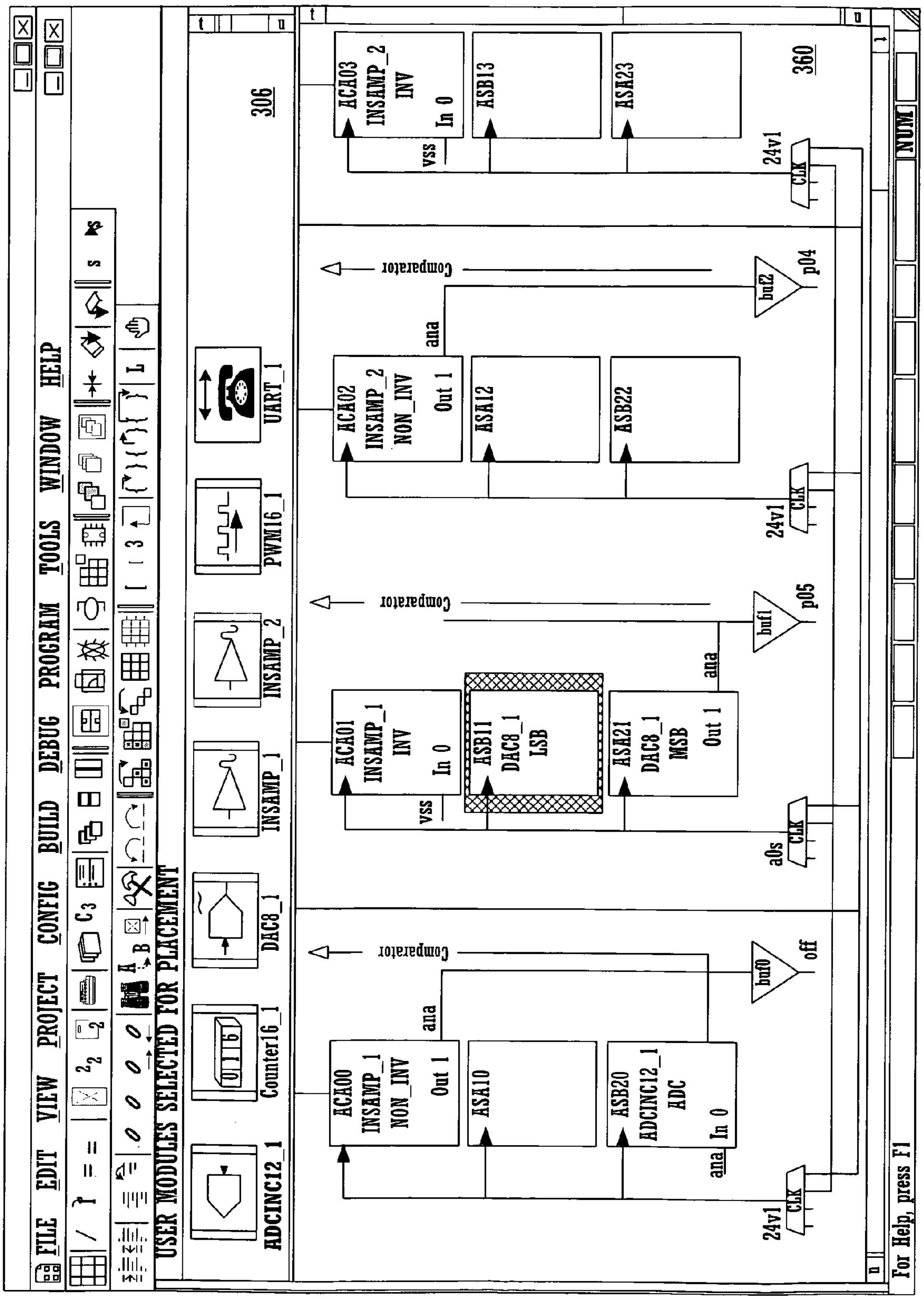
Figure 3C:
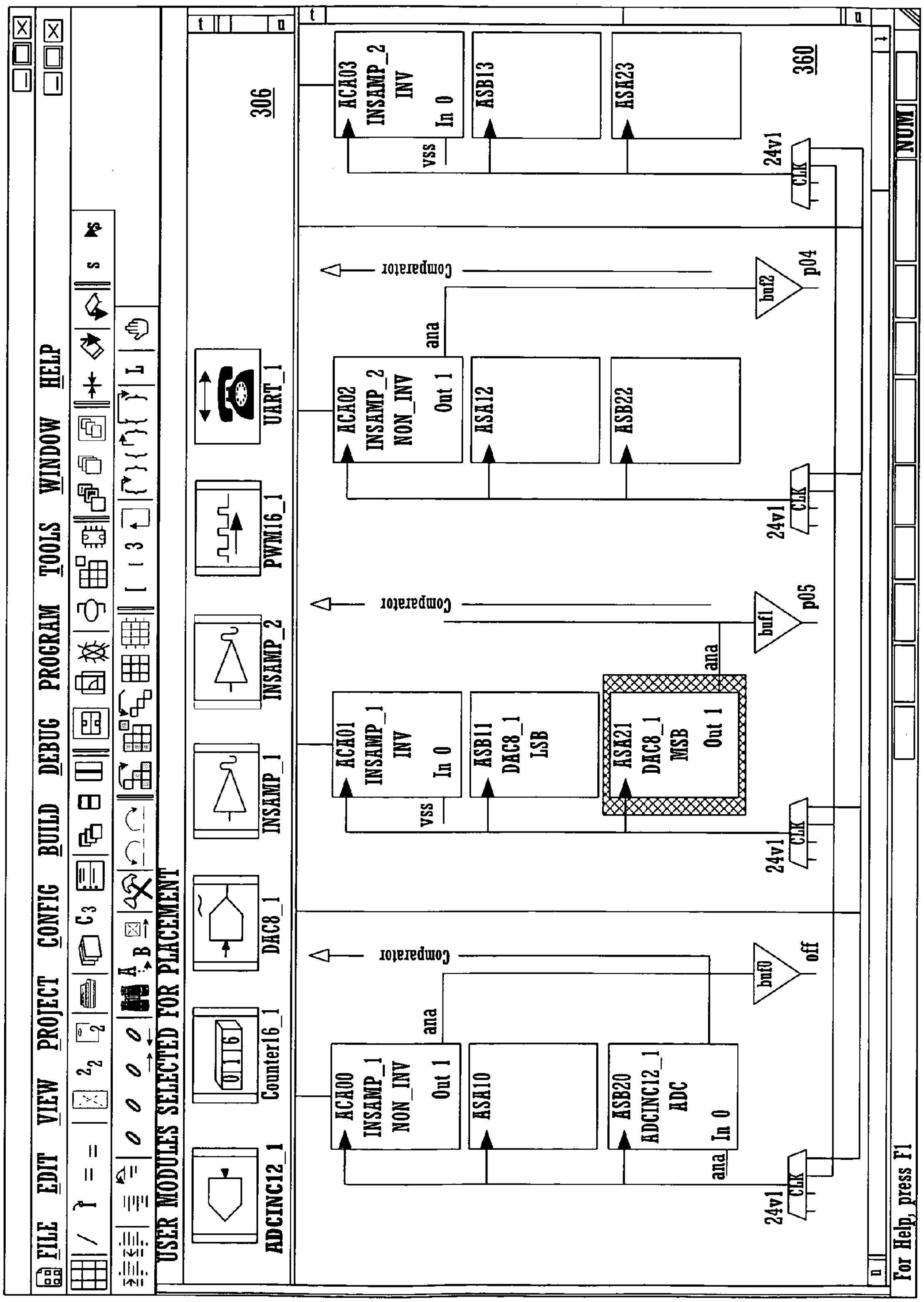

Referring now to FIGS. 3A–3C and to step 240 of FIG. 2, after placing a user module 304, a user may desire to move it to another programmable system block 410 (or blocks). In step 240, the user may request a new position for the user module 304 by, for example, clicking a next placement icon 371. In response to this, a new placement may be computed and displayed. FIGS. 3A–3C illustrate three possible positions for the analog portion of the ADCINC12_1 user module 304. Placements that are incompatible with the user module requirements are automatically pruned out by the software and therefore are not displayed as valid placements. In one embodiment, all positions are shown to the user, sequentially, each time the next placement icon 371 is selected. However, if a potential placement involves a programmable system block 410 that has already been used (e.g., by another placed user module 304), then in these cases the place user module icon 372 is grayed out indicating that this placement is only valid if the resources were vacant. This allows the user to see all possible placements.

If a user module 304 consists of both and digital 410*a* and analog blocks 410*b*, the system may show next positions for the digital 410*a* and analog blocks 410*b* separately. Thus, the user may change the placement of one without affecting the other. For example, the position of the analog block 410*b* of the ADCINC12_1 user module 304 is moved in FIGS. 3A–3C. However, the digital blocks 410*a* for that module 304 do not move at this time. The user may separately seek a new position for those blocks 410 (e.g., digital blocks DBA00 and DBA01 in FIG. 1B). Embodiments allow for multiple different classes to be separately placed. For example, rather than placing analog and digital blocks separately, the user may place memory, routing, and I/O separately in an embodiment which is not illustrated in the Figures. The present invention is well-suited to placing any number of classes separately. Furthermore, when placing a user module 304 with multiple classes, the system may highlight active resource images (e.g., those currently being placed) in a different color than inactive resource images.

Referring now to step 250 of FIG. 2, the user may then select the new position by clicking on the select position button 372 when the user module 304 is on the desired programmable system block or blocks 410.

User module next placement is described in co-pending U.S. patent application Ser. No. 09/989,781, filed concurrently herewith, entitled "SYSTEM AND METHOD FOR DECOUPLING AND ITERATING RESOURCES ASSOCIATED WITH A MODULE," by Ogami et al., and assigned to the assignee of the present invention and incorporated herein by reference.

The user may repeat steps 210 through 250 to add more user modules 304. Each time a new user module is selected, a system resource window is updated. Referring again to FIG. 1A, for each User Module 304 selected, the system updates the data in a resource manager window 350 with the number of occupied programmable system blocks 410, along with RAM and ROM usage used by the current set of "selected" User Modules 304. The system may also prevent a user from selecting a User Module 304 if it requires more resources than are currently available. Tracking the available space and memory of configurations for the design may be performed intermittently during the whole process of configuring the microcontroller. There is also a live graph tracking the programmable system blocks 410 used by percentage. The RAM and ROM monitors track the amount of RAM and ROM required to employ each selected User Module 304.

Figure 4:
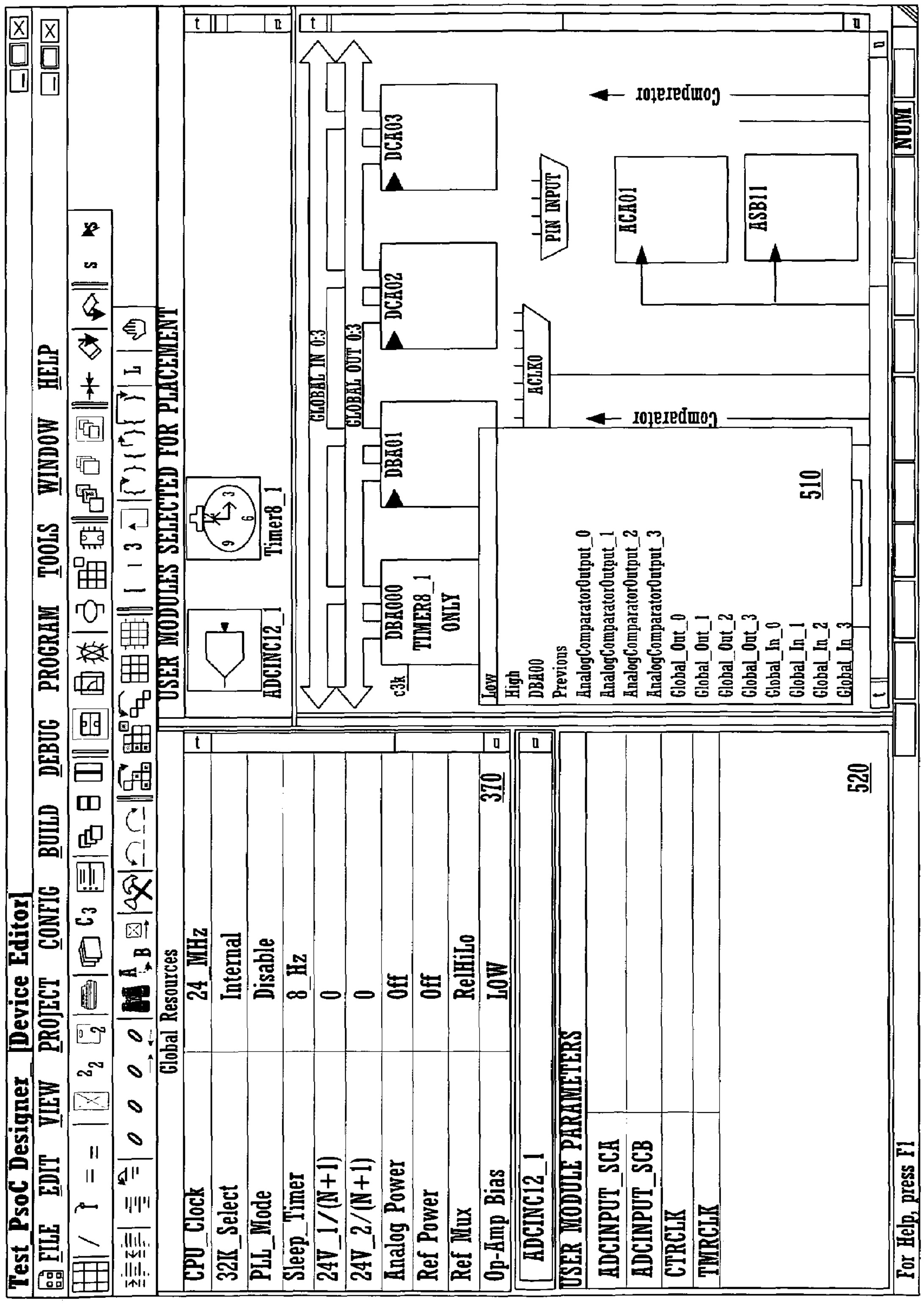
FIG. 4 is a diagram illustrating a graphical user interface allowing selection of user module parameters, according to an embodiment of the present invention.

After the user has selected one or more user modules 304, the user selects global parameters and user module parameters. Embodiments allow a user to select user module parameters, such as, for example, the gain of an amplifier, a clock speed, etc. Referring now to FIG. 4 and to step 260 of FIG. 2, in response to a user clicking on a region on a programmable system block 410 an interface 510 is displayed which allows the setting of user module parameters. For example, the user may place "the cursor" over the lower-left corner of a programmable system block 410 to set input parameters. The system may display a superficial chip or a changed cursor in response to this. The user may then left-click a mouse, for example, to bring up a user module parameter window 510 to configure the user module input parameters. The process may be repeated in the lower-right corner of the programmable system block 410 for output parameters and on the upper-left corner for clock parameters. The present invention is not limited to these steps for bringing up a user module pop-up window 510, however. The system may then display the selected parameters in a user module parameter window 520. Various pop-up windows may be data driven in that the contents of the pop-up window may depend on, for example, the user module 304 selected. Alternatively, user parameters may be set in the user module parameter window 520.

When the user module 304 is placed (e.g., instantiated) on a particular programmable system block 410 the register settings and parameter settings are mapped to a physical register address on the chip. This also associates interrupt vectors that the user module 304 uses based on the programmable system block 410. Each of the digital blocks 410*a* maps to one vector and each column of analog blocks 410*b* maps to another vector. Once the user modules 304 are placed and the parameters are set, all the physical address registers that are associated with that user module 304 are fixed and the register values are determined.

In addition to setting user module parameters, the user also may set global parameters. For example, referring still to FIG. 4, a global resource window 370 is seen. Global resources may be hardware settings that determine the underlying operation of the part (e.g., the CPU_Clock, which may designate the speed in which the microcontroller processes). These settings may be used to program global registers, which may be in addition to the registers set by configuring the user module parameters.

Figure 5A:
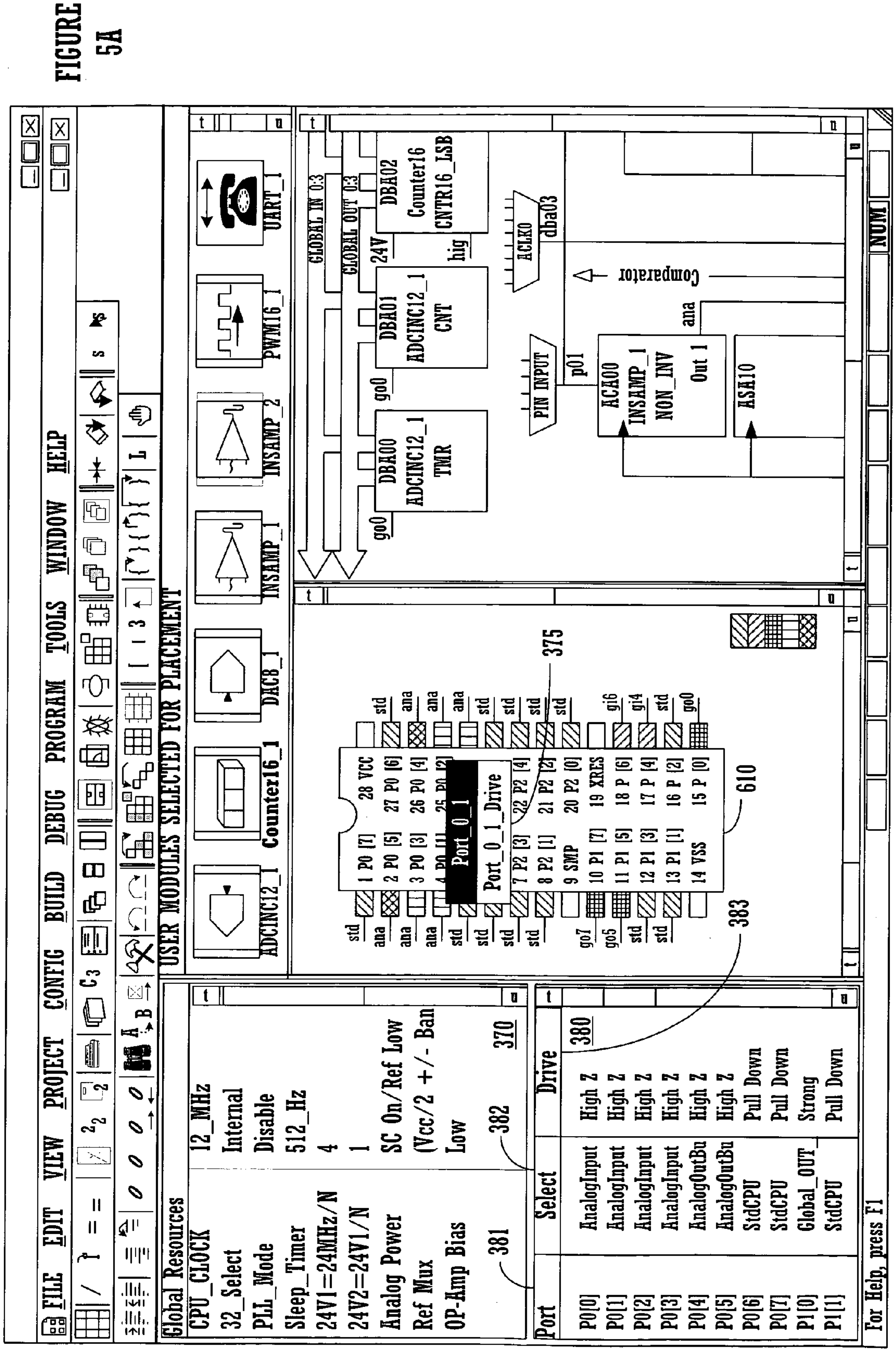
FIG. 5A, FIG. 5B, and FIG. 5C are diagrams illustrating graphical user interfaces for facilitating configuring I/O pins, according to an embodiment of the present invention.
Figure 5B:
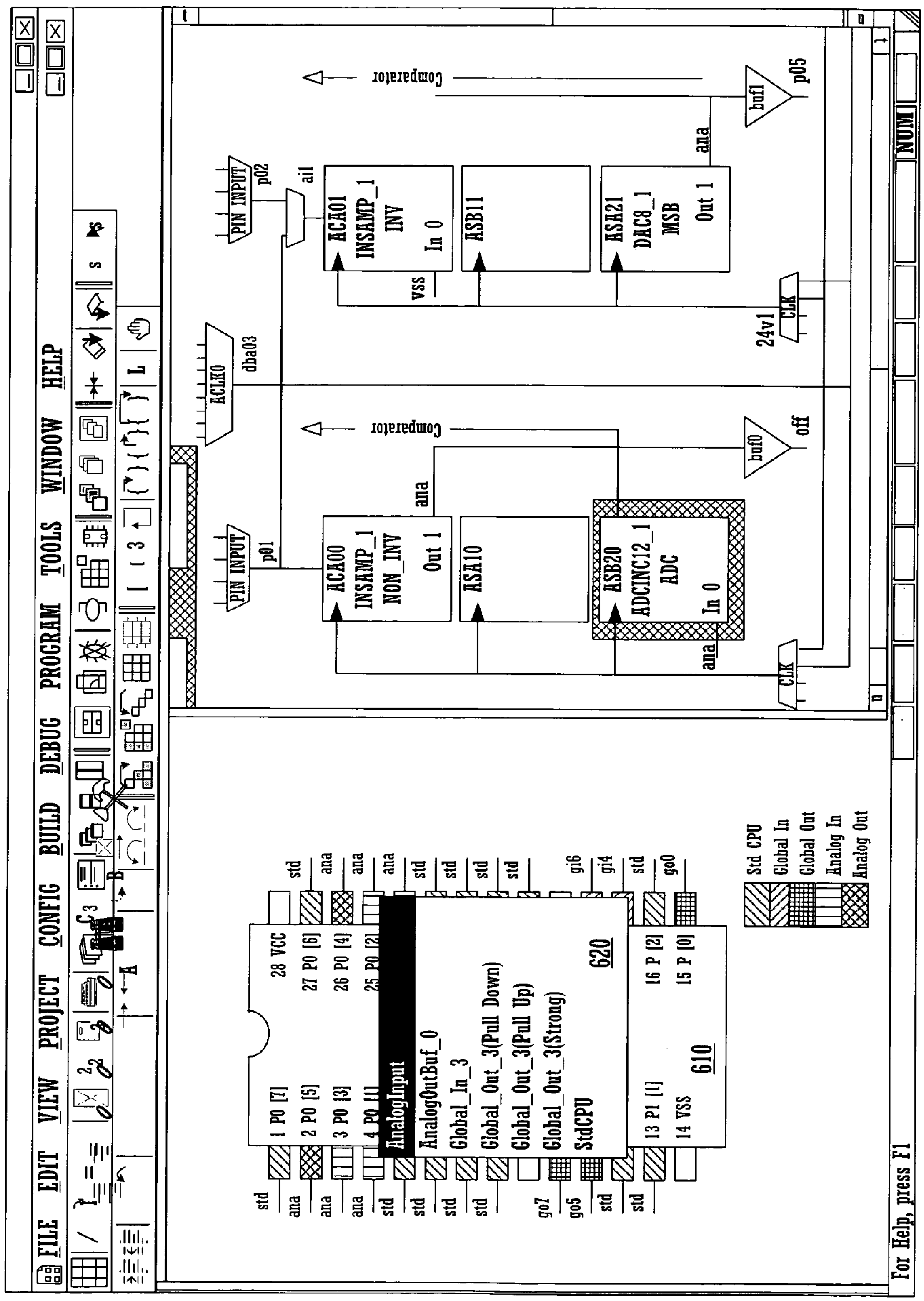
Figure 5C:
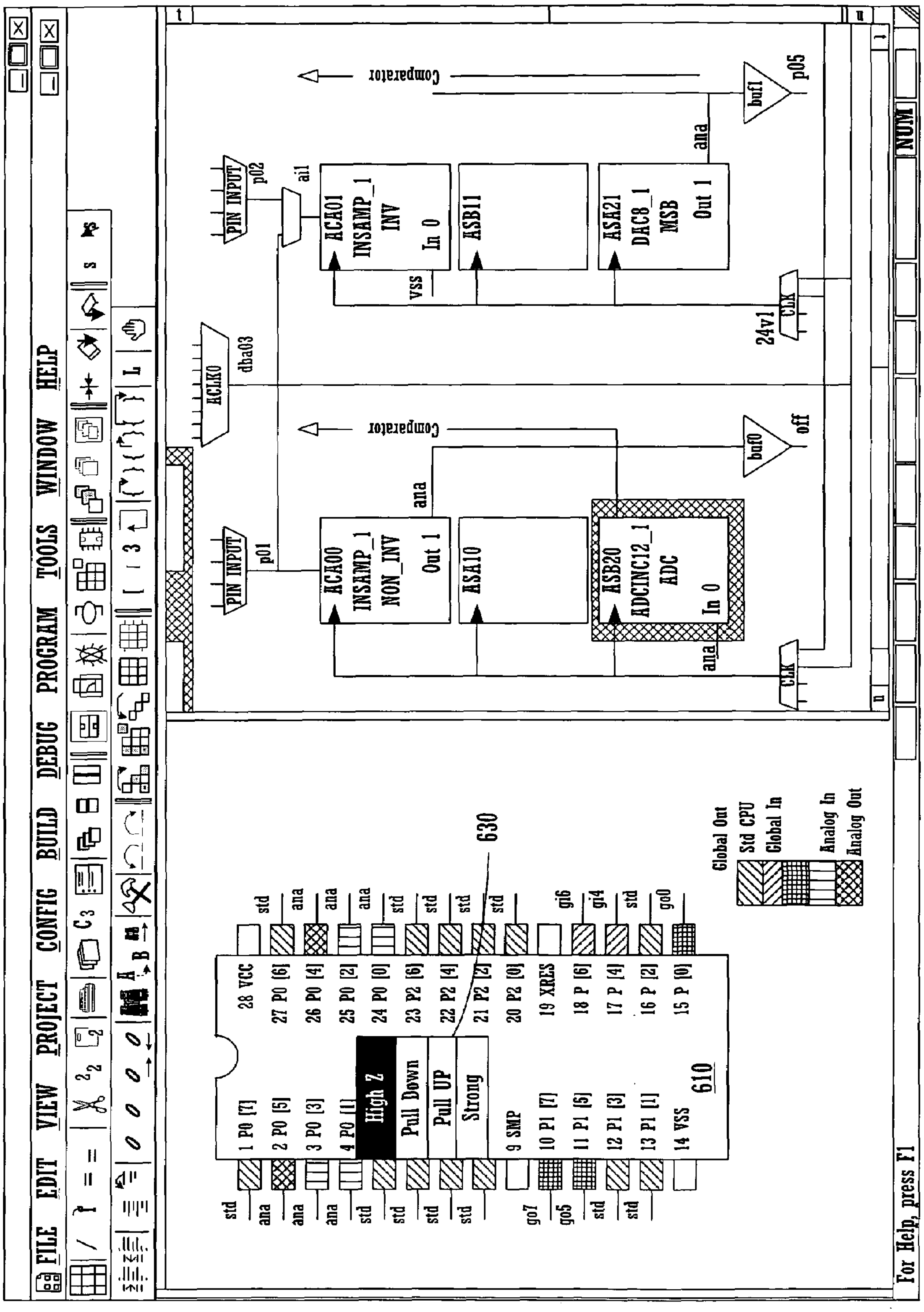

Referring now to FIGS. 5A–5C and to step 270 of FIG. 2, the user selects input/output pin configurations. One embodiment provides for a graphical user interface for facilitating the configuration of I/O pins in a microcontroller software design tool. By specifying a programmable system block 410 to a pin-out, a user may make a physical connection between the software configuration and the hardware (e.g., the microcontroller). Each pin has a pin number associated therewith. Referring to FIG. 5A, when the user clicks on a pin of GUI 610, a small window 375 opens allowing the pin type (e.g., Port_0_1) and drive type (e.g., Port_0_1_Drive) to be configured. Referring now to window 620 of FIG. 5B, the pin type may include analog input or analog output or global bus, etc. Referring now to window 630 of FIG. 5C, the drive type may include high-z, pull-up, pull-down, strong, etc. The windows 620 and 630 may include a list that contains items that can be selected using the cursor. When the cursor is clicked outside of the windows 620 or 630, then the windows 620, 630 disappear automatically.

In another embodiment, a pin parameter table is provided to configure the pins. Referring to FIG. 5A, the pin parameter table 380 includes a column for pin number 381, pin type 382 and drive type 383. The entries in the pin parameter table 380 can be selected by the cursor and again, the relevant window will open so that pin type or drive type can be selected. Therefore, the GUI of the chip 610 or the pin parameter table 380 can be used to configure the pins.

Each pin may contain three register values for configuration of both pin type and drive type. By using this user interface, the user need not be concerned with remembering register values, etc., for configuring the pins. Further, the user need not worry about how the configuration is to be done using the registers.

Pin configuration is described in co-pending U.S. patent application Ser. No. 10/032,986, filed Oct. 29, 2001, entitled "PIN-OUT CONNECTIONS/DRIVE LEVELS DIRECT-SET BY DROP DOWN LIST," by Ogami et al., and assigned to the assignee of the present invention and incorporated herein by reference.

Figure 6A:
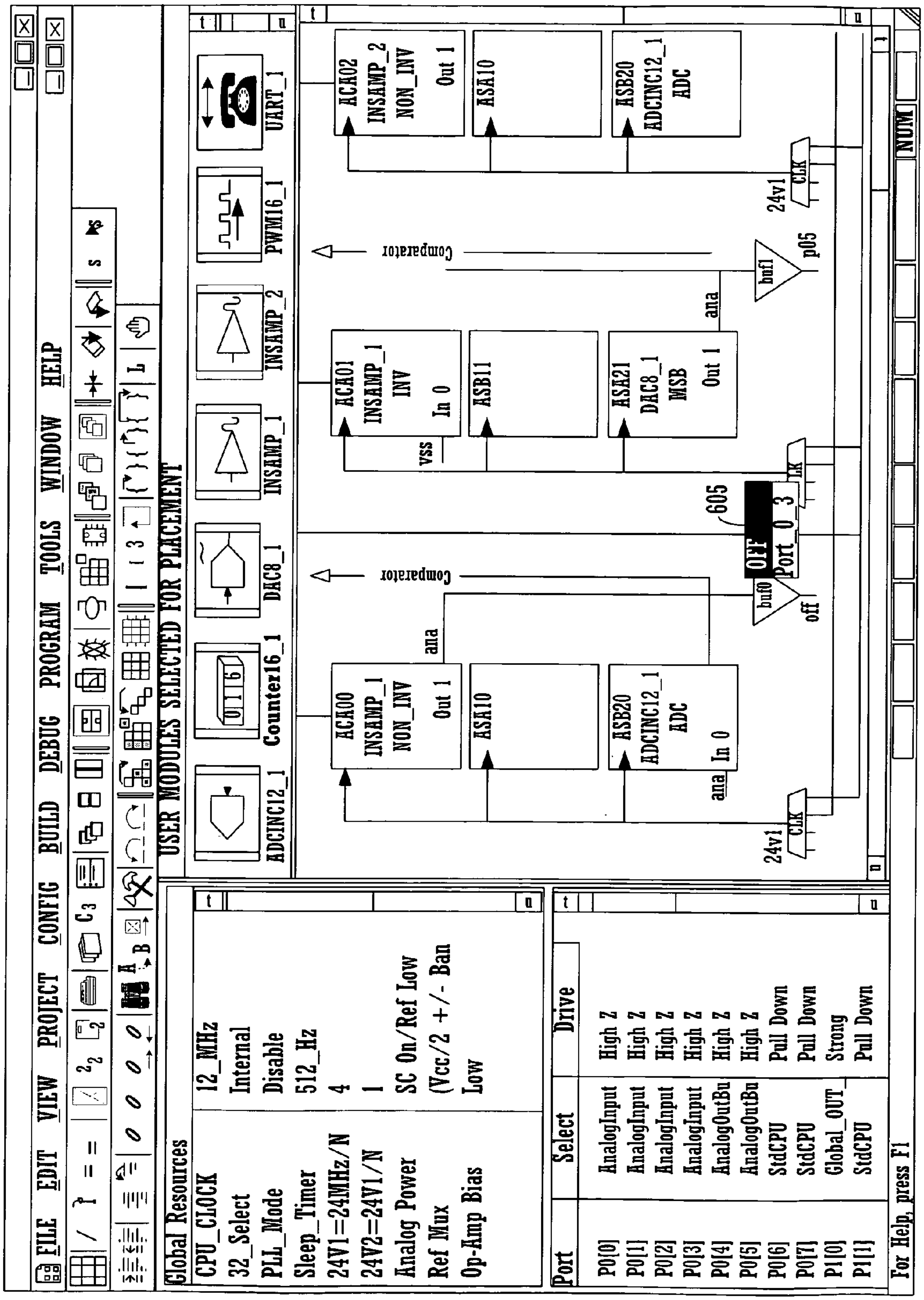
FIG. 6A, FIG. 6B, FIG. 6C, and FIG. 6D are illustrations of graphical user interfaces for configuring interconnections between programmable system blocks, according to an embodiment of the present invention.
Figure 6B:
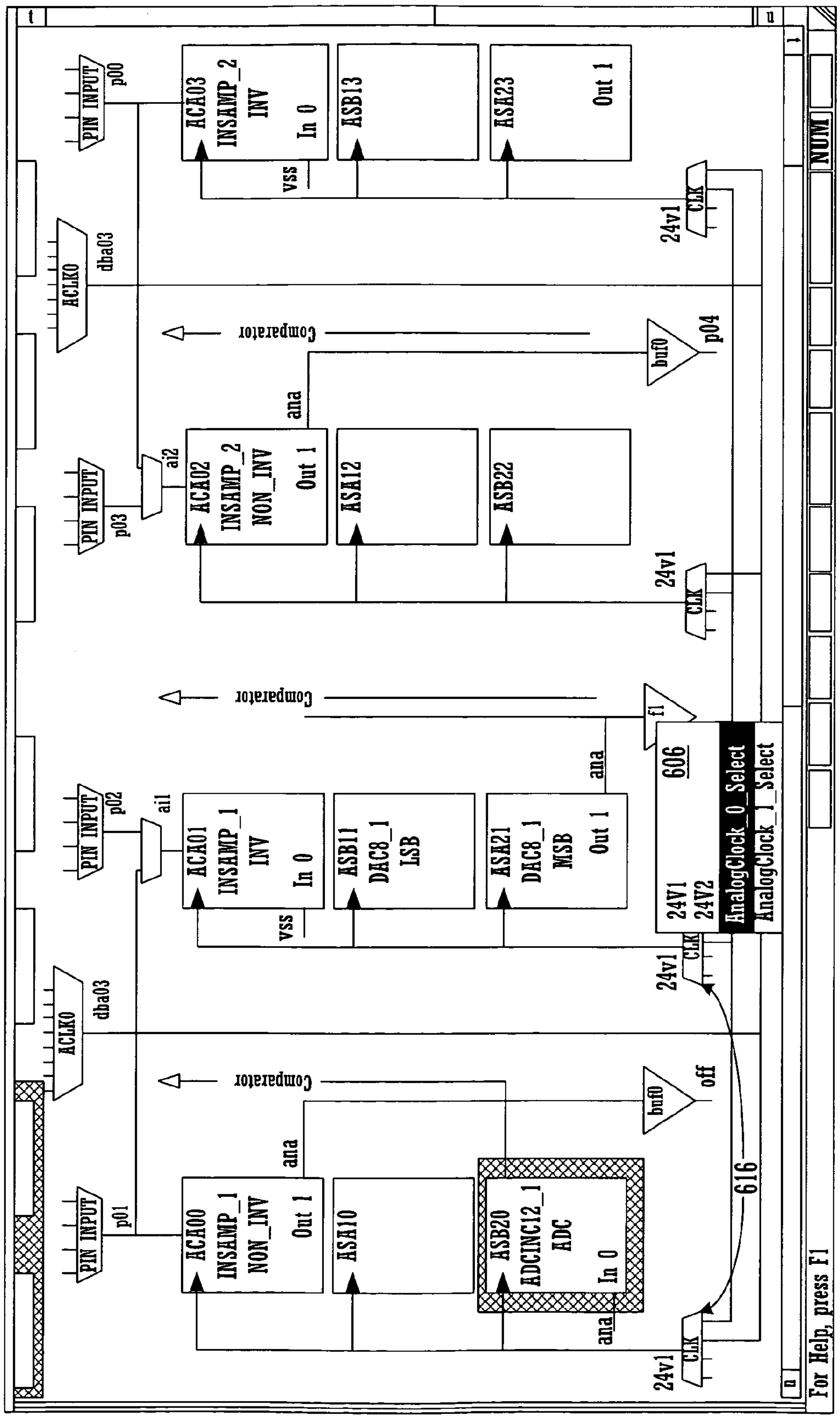
Figure 6C:
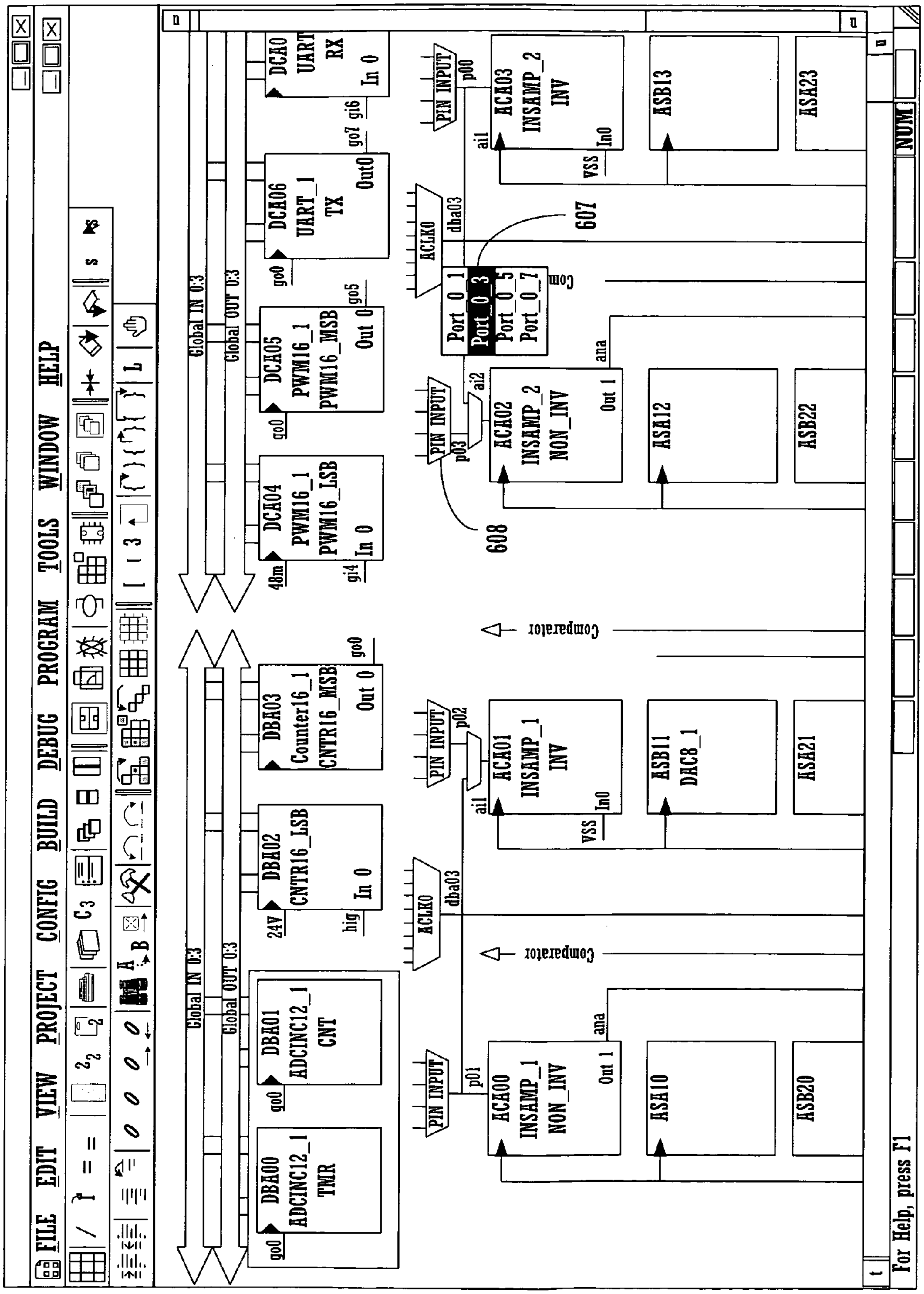
Figure 6D:
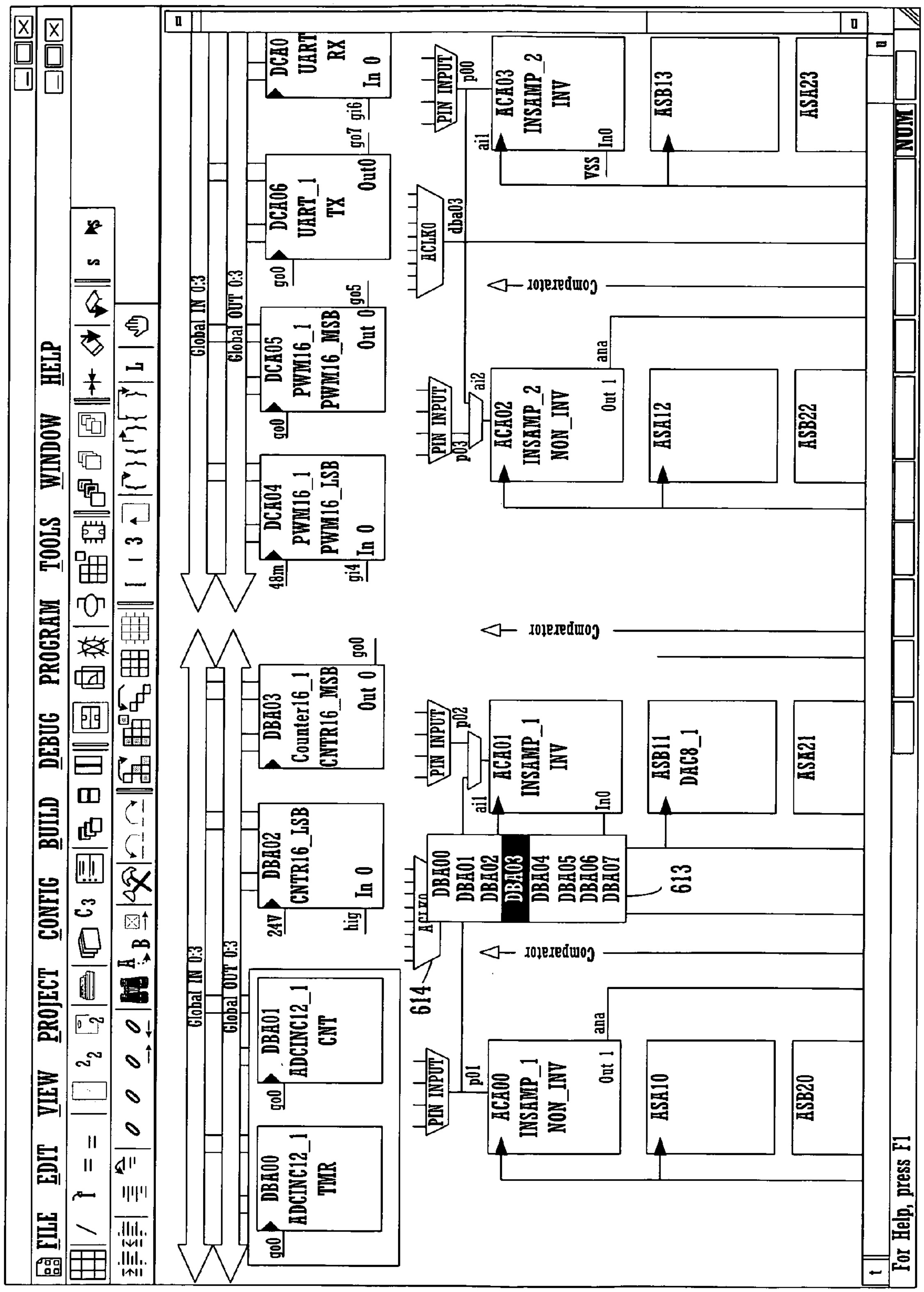

Referring now to FIGS. 6A–6D and to step 280 of FIG. 2, the user selects programmable system block 410 interconnectivity. Embodiments provide many different windows to assist the user in setting various parameters to specify interconnectivity of programmable system blocks 410. Referring to FIG. 6A, the user may cause window 605 to appear to configure the analog output buffer. Referring to FIG. 6B, the user may cause a clock window 606 to appear by clicking on a clock MUX 616 to configure which clock will be the input to a column of analog programmable system blocks 410*b*. Referring to FIG. 6C a port selection window 607 is shown. The port selection window 607 may be made to appear by clicking on or near the pin input MUX 608. The user may then select the input port. Referring now to FIG. 6D, the user may click on or near the analog clocking MUX 614 to cause a window 613 to appear to select which digital programmable system block 410*a* should be selected by the clock MUX (616 of FIG. 6B).

Then, referring to step 290 the user edits source code. As a first part of this step, the user may cause the system to automatically generate Application Program Interfaces (APIs), source code to implement the user's design, a data sheet of the user's design, and interrupt vectors. For example, referring to FIG. 1A, the user clicks on the generate application code button 301. The system may use all device configurations to update existing assembly-source and C compiler code and generates Application Program Interfaces (APIs) and Interrupt Service Routine (ISR) shells. At this time, the system also creates a data sheet based on the part configurations. Advantageously, the automatic generation of APIs and source code makes this task much faster and less error prone than many conventional methods. Embodiments produce files that are suitable for use with emulators and debuggers to allow these configurations to be emulated and debugged in a simple and convenient fashion.

Now referring to FIG. 1D, the user may select files from the source tree window 366 and edit them in the editor window 365. The user may use the APIs that were automatically generated to cause the user modules to implement predetermined functions. The user may also edit Interrupt Service Routines (ISRs) that are automatically generated. In this fashion, the user need not know all of the details of the underlying registers when programming a microcontroller.

The preferred embodiment of the present invention, a method for programming a microcontroller, is thus described. While the present invention has been described in particular embodiments, it should be appreciated that the present invention should not be construed as limited by such embodiments, but rather construed according to the below claims.

What is claimed is:

1. A method of designing a circuit for a programmable device, said method comprising:

a) a user selecting a first module of a plurality of modules;

b) said user placing said first module in a graphical user interface, wherein said graphical user interface comprises a plurality of resource images representing a layout of resources in said programmable device in which to implement said modules, and wherein said placement is an allowable position overlaying at least one of said resource images and is based on characteristics of said first module and characteristics of said layout of resources;

c) said user repeating a) and b) to place multiple modules overlaying additional resource images in said graphical user interface, wherein said circuit comprises said placed modules; and d) said user selecting parameters for at least one of said placed modules.

2. The method of claim 1, further comprising:

e) selecting a new position for said first module in said graphical user interface by causing said first module to be moved from a first resource image in said graphical user interface to a second resource image in said graphical user interface.

3. The method of claim 1, further comprising:

e) selecting pin configurations for said placed modules by:

e1) causing a window to be displayed by selecting a region of a graphical user interface representing a target device in which to implement said circuit, said window providing selections for configuring a pin; and e2) selecting a pin configuration provided in said window, wherein said pin is configured; and e3) repeating e1) and e2) for additional pins.

4. The method of claim 1, further comprising:

e) configuring the interconnectivity between resource images in said graphical user interface, wherein interconnections are made between said placed modules.

5. The method of claim 1, further comprising:

e) creating a source code program using an application program interface (API), wherein said API is for calling a routine to cause said first module to perform a predetermined function.

6. A method of designing a circuit for a programmable device, said method comprising:

selecting a module from a plurality of predefined modules to be used in said circuit;

requesting a valid placement for said module in a graphical user interface comprising resource images representing programmable resources in said programmable device, said valid placement specifying at least one of said resource images; and selecting said valid placement to place said module in said graphical user interface.

7. A method as recited in claim 6, wherein said resource images comprise images corresponding to programmable analog blocks in said programmable device.

8. A method as recited in claim 6, wherein said resource images comprise images corresponding to programmable digital blocks in said programmable device.

9. The method of claim 6, further comprising:

requesting another valid position for said module in said graphical user interface.

10. The method of claim 6, further comprising:

selecting additional modules to be used in said circuit; and requesting valid placements for said additional modules in said graphical user interface, said valid placements for said additional modules specifying at least one unique resource image for each additional module.

11. The method of claim 6, further comprising:

configuring interconnectivity between resource images in said graphical user interface to configure interconnectivity of said programmable resources.

12. The method of claim 6, further comprising:

selecting pin configurations for said module by:

causing a window to be displayed, said window providing selections for configuring an input/output pin; and selecting a configuration provided in said window, wherein said input/output pin is configured.

13. The method of claim 6, further comprising:

selecting a parameter for said module by:

causing a window to be displayed for said module, said window providing selections for setting said parameters; and selecting a parameter from said window, wherein said parameter is selected for said module.

14. The method of claim 6, further comprising:

creating a source code program using an application program interface (API), wherein said API is for calling a routine to cause said module to perform a predetermined function.

15. A method of using a graphical user interface to facilitate implementing a design in a programmable device, said method comprising:

selecting a module from a plurality of predefined modules for placement in said graphical user interface comprising resource images representing programmable resources of said programmable device;

requesting valid placements for said module in said graphical user interface, each of said valid placements specifying at least one of said resource images;

receiving respective indications of valid placements for said module in said graphical user interface; and selecting one of said valid placements to place said module in said graphical user interface.

16. A method as recited in claim 15 wherein said programmable resources comprise programmable analog blocks.

17. A method as recited in claim 15 wherein said programmable resources comprise programmable digital blocks.

18. A method as recited in claim 15 further comprising configuring parameters for said module using said graphical user interface.

19. A method as recited in claim 18 wherein said selecting one of said valid placements causes said parameters to be mapped to a register address of said programmable device.

20. A method as recited in claim 15 further comprising configuring pin inputs/outputs for said design using said graphical user interface.

21. A method as recited in claim 15 further comprising configuring interconnectivity of said programmable resources using said graphical user interface.

* * * * *